United States Patent
Mizoguchi et al.

(10) Patent No.: US 10,120,009 B2
(45) Date of Patent: Nov. 6, 2018

(54) GROUND-FAULT DETERMINATION APPARATUS

(71) Applicant: DENSO CORPORATION, Kariya, Aichi-pref. (JP)

(72) Inventors: Tomomichi Mizoguchi, Kariya (JP); Hayato Mizoguchi, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/982,635

(22) Filed: Dec. 29, 2015

(65) Prior Publication Data

US 2016/0202301 A1 Jul. 14, 2016

(30) Foreign Application Priority Data

Jan. 9, 2015 (JP) ................................. 2015-002857

(51) Int. Cl.
*G01R 31/00* (2006.01)
*G01R 31/02* (2006.01)
*G01R 31/42* (2006.01)

(52) U.S. Cl.
CPC ......... *G01R 31/005* (2013.01); *G01R 31/025* (2013.01); *G01R 31/007* (2013.01); *G01R 31/42* (2013.01)

(58) Field of Classification Search
CPC ............................ G01R 31/005; G01R 31/025
USPC .......................... 324/503, 500, 504, 509, 512
See application file for complete search history.

(56) References Cited

U.S. PATENT DOCUMENTS

| 6,320,389 | B1 | 11/2001 | Tamesue et al. | |
| 2009/0021221 | A1* | 1/2009 | Krauer | B60L 11/1875 320/153 |
| 2009/0134881 | A1* | 5/2009 | Tachizaki | B60L 3/0023 324/551 |
| 2009/0278547 | A1* | 11/2009 | Acena | G01R 31/025 324/509 |
| 2011/0216453 | A1* | 9/2011 | Haines | H02H 9/00 361/49 |

(Continued)

FOREIGN PATENT DOCUMENTS

| JP | H08-70503 A | 3/1996 |
| JP | H11-218554 A | 8/1999 |

(Continued)

*Primary Examiner* — Giovanni Astacio-Oquendo
*Assistant Examiner* — Adam Clarke
(74) *Attorney, Agent, or Firm* — Oliff PLC

(57) ABSTRACT

A ground-fault determination apparatus, which is for use in a vehicle power supply system including a DC power source and a DC supply circuit, includes an acquisition unit that applies an AC signal to the DC supply circuit through a series connection of a resistor and a capacitor to acquire a peak value of the AC signal divided by a resistance of the resistor and an insulation resistance of the DC supply circuit, a ground-fault determination unit that determines presence of a ground-fault based on a comparison between a determination threshold and the peak value, an estimation unit that estimates at least one of a maximum output voltage of the DC supply circuit and a common capacitance between the DC supply circuit and a vehicle body, and a setting unit that sets the determination threshold based on at least one of the maximum output voltage and the common capacitance.

8 Claims, 8 Drawing Sheets

(56) References Cited

U.S. PATENT DOCUMENTS

2012/0161778 A1* 6/2012 Fernandez Banares ..................... G01R 31/025
324/503
2012/0280697 A1* 11/2012 Morimoto ............. B60L 3/0069
324/606
2014/0368211 A1* 12/2014 Inoue ................... B60L 3/0069
324/509

FOREIGN PATENT DOCUMENTS

| | | |
|---|---|---|
| JP | 2001-330643 A | 11/2001 |
| JP | 2004-347372 A | 12/2004 |
| JP | 2011-234536 A | 11/2011 |
| JP | 2014-155329 A | 8/2014 |

* cited by examiner

GROUND-FAULT DETERMINATION APPARATUS

This application claims priority to Japanese Patent Application No. 2015-2857 filed on Jan. 9, 2015, the entire contents of which are hereby incorporated by reference.

BACKGROUND OF THE INVENTION

1. Field of the Invention

The present invention relates to a ground-fault determination apparatus mounted on a vehicle having a DC power source for determining presence of a ground-fault.

2. Description of Related Art

Generally, vehicles which use electric power as vehicle driving power are provided with a DC power source and a DC supply circuit including a power conversion circuit for charging and discharging the DC power source, the DC supply circuit being insulated from the vehicle body. If the insulation between the DC supply circuit and the vehicle body is lowered, current may flow unexpectedly through the vehicle body. Accordingly, it is necessary to detect a ground-fault of the DC supply circuit.

To this end, for example, a capacitor is connected to the DC supply circuit through a resistor so as to output an AC signal from the combination of the capacitor and the resistor to the DC supply circuit. It is possible to determine presence or absence of a ground-fault based on the peak value of the AC signal.

The peak value of the AC signal is affected by a common capacitance which is present between the DC supply circuit and the vehicle body. Therefore, a threshold value to determine presence of a ground-fault is set taking into account a possible change of the peak value of the AC signal, as described in Japanese Patent Application Laid-open No. H11-218554.

Meanwhile, there is a case in which such a DC supply circuit is provided with a charging circuit to enable charging of a DC power source of a vehicle using electric power supplied from an external power source. In this case, since the capacitance of the common capacitor when the DC supply circuit operates with the DC power source being connected with the power conversion circuit is different from that when the DC supply circuit operates with the DC power source being connected with the charging circuit, there is a concern that the accuracy of detection of a ground-fault may be lowered.

SUMMARY

An exemplary embodiment provides a ground-fault determination apparatus for use in a vehicle power supply system including a DC power source and a DC supply circuit having at least one electrical load which charges the DC power source or is charged by the DC power source, the DC power source and the DC supply circuit being insulated from a vehicle body, the ground-fault determination apparatus including:

an acquisition unit that applies an AC signal to the DC supply circuit through a series connection of a resistor and a capacitor to acquire a peak value of the AC signal divided by a resistance of the resistor and an insulation resistance of the DC supply circuit;

a ground-fault determination unit that determines presence or absence of a ground-fault based on a comparison between a predetermined determination threshold and the peak value acquired by the acquisition unit;

an estimation unit that estimates at least one of a maximum output voltage of the DC supply circuit and a common capacitance between the DC supply circuit and the vehicle body; and a setting unit that sets a value of the determination threshold based on at least one of the maximum output voltage and the common capacitance estimated by the estimation unit.

According to the exemplary embodiment, there is provided ground-fault determination apparatus capable of correctly determining presence or absence of a ground-fault in a vehicle.

Other advantages and features of the invention will become apparent from the following description including the drawings and claims.

PREFERRED EMBODIMENTS OF THE INVENTION

Figure 1:
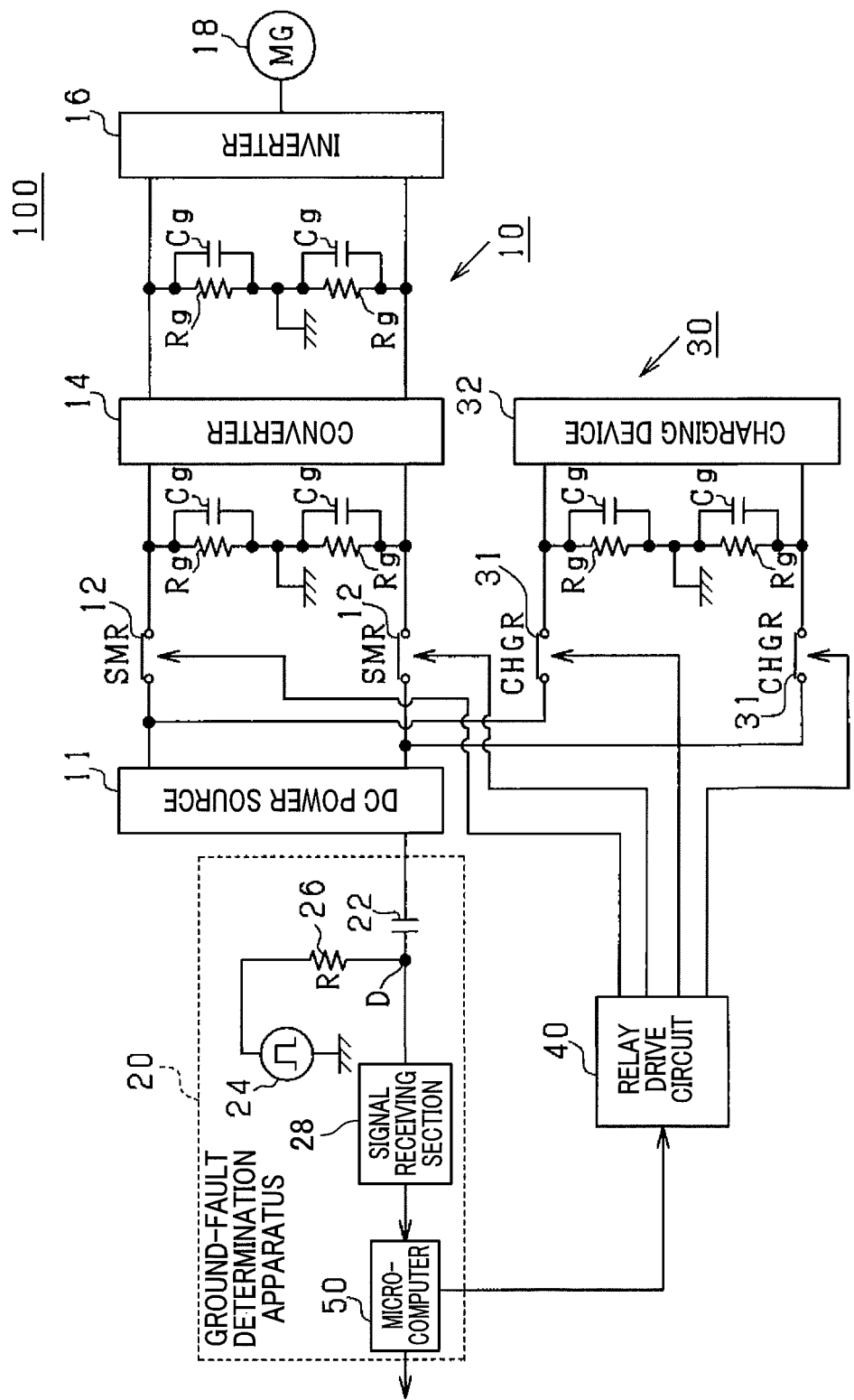
FIG. 1 is a diagram showing the structure of a DC supply circuit mounted on a vehicle as a vehicle power supply system, which includes a DC power source and a ground-fault determination apparatus according to an embodiment of the invention.

In FIG. 1, the reference numeral 100 denotes a DC supply circuit mounted as a vehicle power supply system on a hybrid vehicle, an electric vehicle or the like. The DC supply circuit 100 includes a DC power source 11 whose electric power is used as a vehicle driving power, and which is capable of being charged by electric power supplied from an external power source.

As shown in FIG. 1, the DC supply circuit 100 includes the DC power source 11, a power conversion device 10 as an electrical load and a charging device 30. The DC power source 11 and the power conversion device 10 are connected to each other through a system main relay 12 (referred to as the SMR 12 hereinafter). The DC power source 11 and the charging device 30 are connected to each other through a charge relay 31 (referred to as the CHGR 31 hereinafter). The DC supply circuit 100 is connected with a ground-fault determination apparatus 20.

The DC power source 11 is constituted of rechargeable batteries such as lithium ion batteries which are connected in series. The DC power source 11 generates a high voltage of around 400 V at maximum. The SMR 12 is turned on (closed) at the time of supplying electric power from the DC power source 11 to the power conversion device 10, or supplying electric power from the power conversion device 10 to the DC power source 11.

The power conversion device 10 includes a converter 14, an inverter 16 and an MG 18 as electrical loads. The converter 14 is a DC-DC converter which steps up the voltage of the DC power source 11 and supplies it to the inverter 16. The converter 14 can step up the voltage of the DC power source 11 up to around 750 V at maximum. The converter 14 also steps down the voltage supplied from the inverter 16, and supplies it to the DC power source 11.

The inverter 16 is a DC-AC converter which converts the DC power supplied from the converter 14 into an AC power, and supplies it to the phase windings of the MG 18. The inverter 16 converts the AC power generated by the MG 18 to DC power, and supplies it to the converter 14. At this time, the converter 14 steps down the DC voltage supplied from the inverter 16, and supplies it to the DC power source 11.

The CHGR 31 is turned on when it is connected to an external power source through a not-shown charging plug while the vehicle is not being driven. The charging device 30 charges the DC power source 11 using electric power of the external power source.

The SMR 12 and the CHGR 31 are connected to a relay drive circuit 40. The relay drive circuit 40 switches the connection state of the SMR 12 and the CHGR 31 in accordance with a command signal received from a later-explained microcomputer 50. More specifically, the relay drive circuit 40 turns on the SMR 12 to charge the DC power source 11 when the inverter 16 is in operation, and turns on the CHGR 31 to cause the charging device 30 to charge the DC power source 11 when the inverter 16 is out of operation.

The DC power source 11, the SMR 12 and the power conversion device 10 constitute a first circuit electrically insulated from the vehicle body. The DC power source 11, the CHGR 31 and the charging device 30 constitute a second circuit electrically insulated from the vehicle body. A ground insulation resistance (referred to as the insulation resistance Rg hereinafter) is present between the vehicle body and the converter 14 or inverter 16 of the first circuit, and between the vehicle body and the charging device 30 of the second circuit.

Since these circuits are insulated from the vehicle body, a common capacitance Cg is present between the vehicle body and the convert 14 or the inverter 16 of the first circuit, and between the vehicle body and the charging device 30 of the second circuit. The common capacitance Cg includes a parasitic capacitance and capacitor components of the respective components.

If the insulation resistance Rg decreases, there is a concern that unexpected current flows through the vehicle body. Therefore, the ground-fault determination apparatus 20 makes a ground-fault determination. The ground-fault determination apparatus 20 includes a capacitor 22, an oscillator 24, a resistor 26, a signal receiving section 28 and the microcomputer 50.

The capacitor 22, which is provided for DC insulation between DC supply circuit 100 and the ground-fault determination apparatus 20, is connected to the DC power source circuit 100 at a first end thereof, and connected to the resistor 26 at a second end thereof.

The oscillator 24 generates an AC signal. More specifically, the oscillator 24 generates a voltage signal having a rectangular waveform, and delivers it to a common path of the DC supply circuit 100 connected to the capacitor 22. The common path is a wiring path between the DC power source 11 and the resistor 26, more precisely between the second end of the capacitor 22 and the resistor 26.

The signal receiving section 28 receives the voltage applied to a connection node D between the resistor 26 and the capacitor 22, and outputs it as a voltage detection signal to an A/D converter (not shown). The A/D converter converts the voltage detection signal inputted from the signal receiving section 28, and outputs it to the microcomputer 50. In this embodiment, the microcomputer 50 and the A/D converter are disposed as separate components. However, the microcomputer 50 may incorporate the A/D converter.

The microcomputer 50 includes a CPU, a RAM, a ROM and a flash memory. The CPU executes various processes in accordance with programs stored in the ROM. The microcomputer 50 determines presence or absence of a ground-fault by comparing the voltage detection signal inputted from the A/D converter with a ground-fault determination threshold.

In the structure in which the DC power source 11 is connected with the power conversion device 10 or the charging device 30, the common capacitance Cg changes depending on the load connection state (the connection state of these components to the DC power source 11), causing the peak value of the AC signal detected by the ground-fault determination apparatus 20 to change. Hence, the ground-fault determination is affected by the change of the common capacitance Cg due to the change of the load connection state. Here, the effect of the change of the common capacitance Cg on the ground-fault determination is explained with reference to FIGS. 2A and 2B.

Figure 2A:
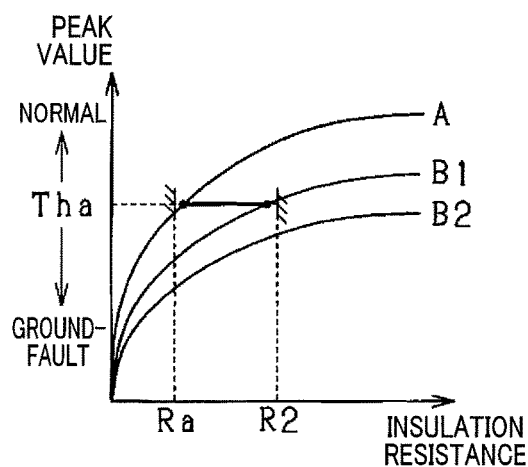
FIGS. 2A and 2B are graphs showing a relationship between the peak value of the AC signal and a determination threshold.
Figure 2B:
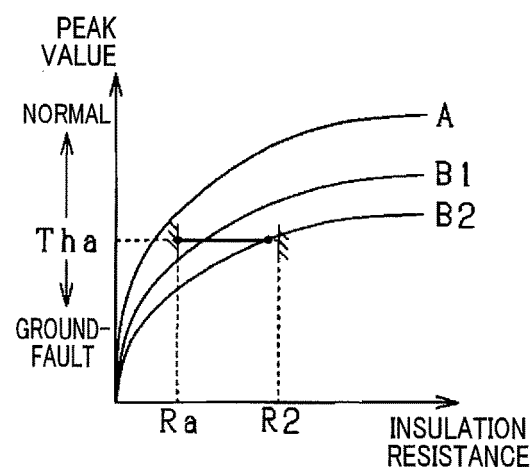
Figure 3:
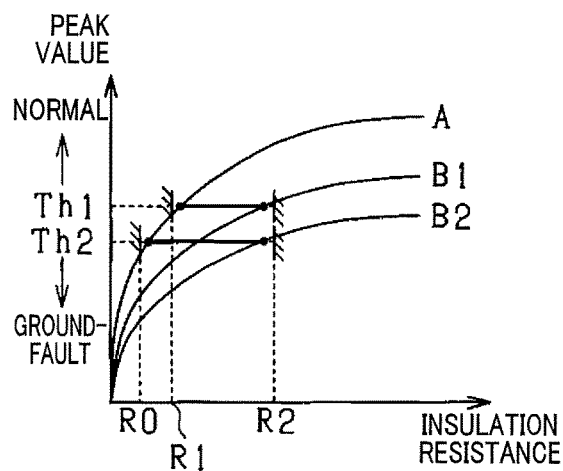
FIG. 3 is a diagram for explaining setting of the determination threshold.

In FIGS. 2A and 2B, the curved line A shows a relationship between the peak value of the AC signal and the insulation resistance Rg when the common capacitance Cg is zero. The curved line B1 shows a relationship between the peak value of the AC signal and the insulation resistance Rg when the common capacitance Cg is relatively small. The curved line B2 shows a relationship between the peak value of the AC signal and the insulation resistance Rg when the common capacitance Cg is relatively large. The determination threshold value Tha shown in FIGS. 2A and 2B is set to such a value that, when the insulation resistance is larger than a predetermined resistance R2 above which sufficient insulation can be ensured with the vehicle body, the peak value is larger than or equal to the threshold value Tha (normal state), and when the insulation resistance is smaller than a predetermined resistance Ra equivalent to the lower limit of the insulation resistance Rg required of the DC supply circuit 100, the peak value is smaller than the threshold value Tha (ground-fault state).

When the DC power source 11 is connected with one of the power conversion device 10 and the charging device 30, and accordingly the common capacitance Cg is relatively small, the peak value of the AC signal is between the line A and the line B1. On the other hand, when the DC power source 11 is connected with both the power conversion device 10 and the charging device 30, and accordingly the common capacitance Cg is relatively large, the peak value of the AC signal is between the line A and the line B2. Therefore, when the peak value of the AC signal changes depending on the load connection state of the DC power source 11, there is a concern that the ground-fault determination may not be made correctly.

For example, if the threshold value Tha is set to a relatively large value for the case in which the peak value changes between the line A and the line B1, it may be erroneously determined that a ground-fault is present although the insulation resistance Rg is larger than R2 when the peak value of the AC signal is on the line B2 as shown in FIG. 2A. Further, if the threshold value Tha is set to a relatively large value for the case in which the peak value reaches the line B2, it may be erroneously determined that a ground-fault is not present although the insulation resistance Rg is smaller than R2 when the peak value of the AC signal is on the line A as shown in FIG. 2A.

The minimum required value of the insulation resistance Rg with the vehicle body is calculated as the product of the insulation resistance value Rt (Q/V) necessary per unit voltage V0. Accordingly, in an example where the maximum output voltage V1 is 750 V while the converter 14 performs the voltage step-up operation, the insulation resistance Rg required of the DC supply circuit 100 exceeds an insulation resistance value R1 (=V1×Rt). Likewise, in an example where the maximum output voltage V2 is 400 V (the terminal voltage of the DC power supply 11) while the converter 14 does not perform the voltage step-up operation and the charging device 30 performs the charging operation, the insulation resistance Rg required of the DC power supply circuit 100 exceeds a resistance value R0 (=V2×Rt).

Therefore, a threshold value Th1 is set while the converter 14 performs the voltage step-up operation, the threshold value Th1 being such a value that a ground-fault is determined to be present if the insulation resistance Rg is smaller than the insulation resistance value R1. On the other hand, a threshold value Th2 (<Th1) is set while the convert 14 does not perform the voltage step-up operation, the threshold value Th2 being such a value that a ground-fault is determined to be present if the insulation resistance Rg is smaller than the insulation resistance value R0. With these settings, the ground-fault determination can be made correctly depending on the load connection state of the DC power source 11, ensuring the necessary insulation performance required of the DC supply circuit 100.

The microcomputer 50 sets the threshold value depending on the maximum output voltage using the command signal to the relay drive circuit 40. In this embodiment, the converter 14 performs the voltage step-up operation only when the SMR 12 is on and the CHGR 31 is off. In the state where the SMR 12 is on and the CHGR 31 is off, and accordingly the voltage step-up operation is performed, since the maximum output voltage V1 is generated, the determination threshold is set to the threshold value Th1. In the other state where the converter 14 does not perform the voltage step-up operation, that is, when both the CHGR 31 and the SMR 12 are off, or when CHGR 31 is on and the SMR 12 is on or off, since the maximum output voltage V2 is generated, the determination threshold is set to the threshold value Th2.

Figure 4:
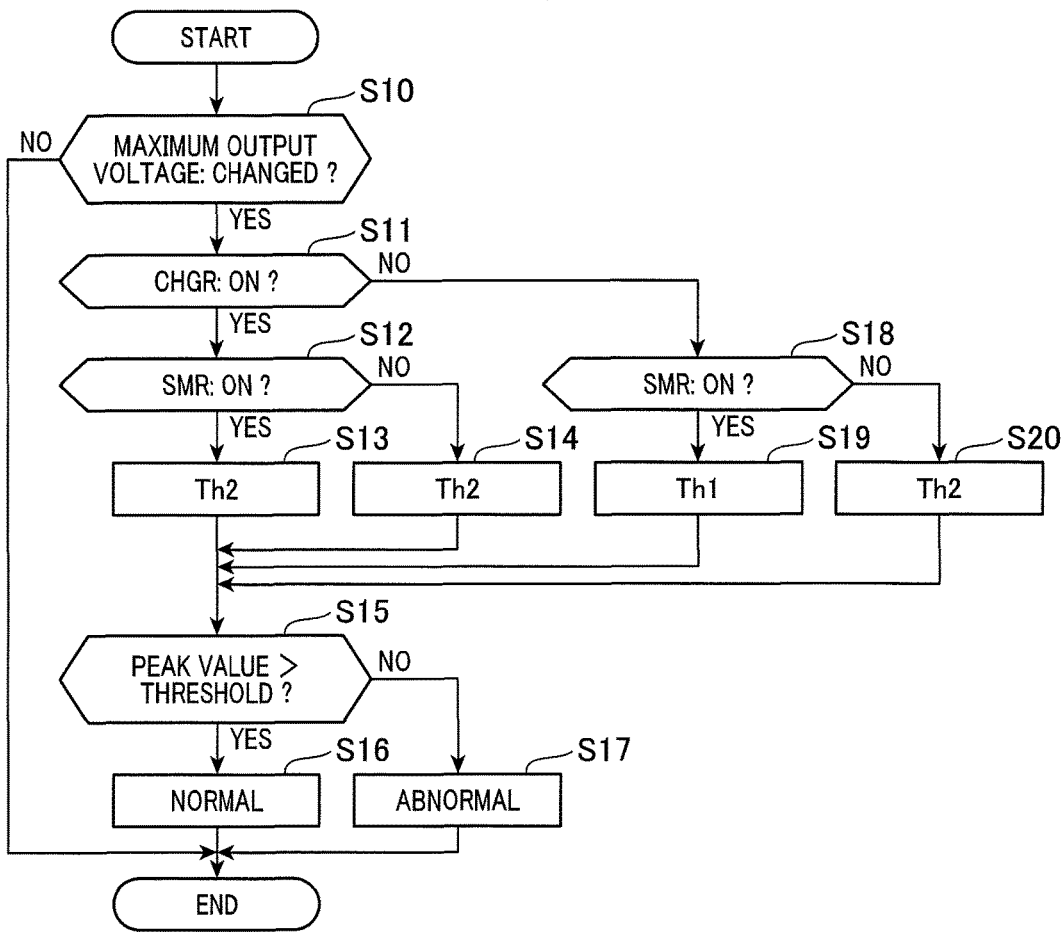
FIG. 4 is a flowchart showing steps of a ground-fault determination process.
Figure 5:
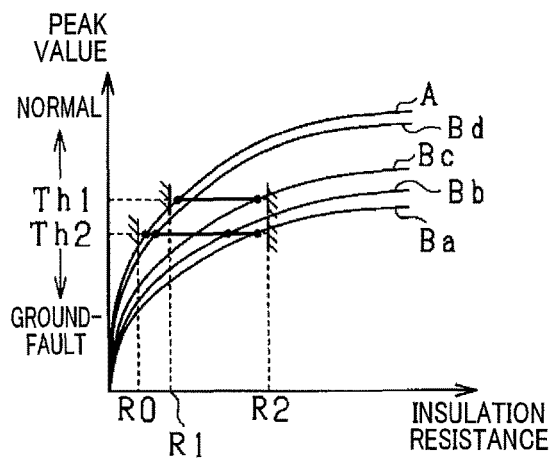
FIG. 5 is a diagram for explaining advantageous effects of the ground-fault determination process.

Next, the ground-fault detection process is explained with reference to FIGS. 4 and 5. FIG. 4 shows steps of the ground-fault detection process performed repeatedly at regular time intervals by the microcomputer 50. FIG. 5 shows relationships between the peak value of the AC signal and the threshold values Th1 and Th2.

The ground-fault detection process begins in step S10 where it is determined whether or not the maximum output voltage V generated by the DC supply circuit 100 will change in value. The determination result in step S10 becomes affirmative if the state of SMR 12 or the CHGR 31 is changed. If the determination result in step S10 is negative, this process is terminated. If the determination result in step S10 is affirmative, the process proceeds to step S11 where it is determined whether or not the CHGR 31 is on. If the CHGR 31 is on, it means that the voltage step-up operation is not performed. In this case, the process proceeds to step S12 to determine whether or not the SMR 12 is on. If the determination result in step S12 is affirmative, since the maximum output voltage V2 is expected to be generated, the determination threshold is set to the threshold value Th2 in subsequent step S13. In step S15 subsequent step S13, it is determined whether or not the peak value of the AC signal detected by the ground-fault determination apparatus 20 is larger than or equal to the threshold value Th2 set in step S13. If the determination result in step S15 is affirmative, the process proceeds to step S16 where it is determined that no ground-fault is present (the state is normal). If the determination result in step S15 is negative, the process proceeds to step S17 where it is determined that a ground-fault is present. In this case where both the CHGR 31 and the SMR 12 are on, the ground-fault determination can be made correctly when the peak value of the AC signal falls to the line Ba as shown in FIG. 5.

If the determination result in step S12 is negative, the process proceeds to step S14 where the determination threshold is set to the threshold value Th2 because the maximum output voltage V2 is expected to be generated. Then, the process proceeds to step S15 to make the ground-fault determination in accordance with whether or not the peak value of the AC signal is larger than or equal to the threshold value Th2 set in step S14. In this case where only the CHGR 31 is on, the ground-fault determination can be made correctly when the peak value of the AC signal falls to the line Bb (>Ba).

If the determination result in step S11 is negative, the process proceeds to step S18 where it is determined whether or not the SMR 12 is on. If the determination result in step S12 is affirmative, since the voltage step-up operation is performed and accordingly the maximum output voltage V1 is expected to be generated, the determination threshold is set to the threshold value Th1. Then, the process proceeds to step S15 to make the ground-fault determination in accordance with whether or not the peak value of the AC signal is larger than or equal to the threshold value Th1 set in step S19. In this case where the CHGR 31 is off and the SMR 12 is on, the ground-fault determination can be made correctly when the peak value of the AC signal falls to the line Bc (>Bb).

If the determination result in step S18 is negative, since the maximum output voltage V2 is expected to be generated, the process proceeds to step S20 where the determination threshold is set to the threshold value Th2. Thereafter, the process proceeds to step S15 to make the ground-fault determination in accordance with whether or not the peak value of the AC signal is larger than or equal to the threshold value Th2 set in step S20. In this case where both the CHGR 31 and the SMR 12 are off, the ground-fault determination can be made correctly when the peak value of the AC signal falls to the line Bd (>Bc).

The above described embodiment of the invention provides the following advantages.

In the case where determination of presence or absence of a ground-fault is made using the peak value of the AC signal obtained through voltage division by the resistance of the ground-fault determination apparatus 20 and the insulation resistance of the DC supply circuit 100, the state of connection of the electrical load to the DC power source 11 affects the peak value of the AC signal, and accordingly affects the accuracy of the ground-fault determination. Further, when the state of connection of the electrical load to the DC power source 11 is changed, since the maximum output voltage V of the DC supply circuit 100 is changed, the lower limit value of the insulation resistance Rg required of the DC supply circuit is changed. Therefore, the ground-fault determination threshold is set in accordance with the lower limit value of the insulation resistance Rg calculated based on the maximum output voltage V of the DC supply circuit 100. Accordingly, the accuracy of the ground-fault determination made using the peak value of the AC signal can be increased.

The threshold value is set larger when the maximum output voltage V is larger, and set smaller when the maximum output voltage V is smaller. Therefore, the accuracy of the ground-fault determination made using the peak value of the AC signal can be increased irrespective of the maximum output voltage V of the DC supply circuit 100.

When the vehicle is running, the maximum output voltage V is large and the charging device 30 is not connected to the DC power source 11, the common capacitance Cg is small. Accordingly, the accuracy of the ground-fault determination made using the peak value of the AC signal can be increased also in this respect.

If the common capacitance of the DC supply circuit 100 changes, the peak value of the AC signal detected by the ground-fault determination apparatus 20 changes. Accordingly, the ground-fault determination threshold is set depending on the common capacitance to increase the accuracy of the ground-fault determination made using the peak value of the AC signal.

The maximum output voltage V is determined based on the state of the opening/closing means (relays) for making a connection between the DC power source 11 and the electrical load. Accordingly, the ground-fault determination can be made taking into account that the maximum output voltage V is changed if the state of connection of the electrical load to the DC power source 11 through the SMR 12 or the CHGR 31 is changed.

Since the maximum output voltage V is determined based on whether or not the voltage step-up operation is being operated, the ground-fault determination can be made taking into account whether or not the voltage step-up operation is being operated.

It is a matter of course that various modifications can be made to the above described embodiment as described below.

As shown in FIG. 4, in the above embodiment, switching between the threshold value Th1 and the threshold value Th2 is performed depending on the state of the SMR 12 and the state of CHGR 31. However, switching between the threshold value Th1 and the threshold value Th2 may be performed depending on only the state of SMR 12 or the state of the CHGH 31, if it is possible to determine correctly whether or not the voltage step-up operation is being performed by detecting only the state of the SMR 12 or the state of the CHGR 31.

Figure 6:
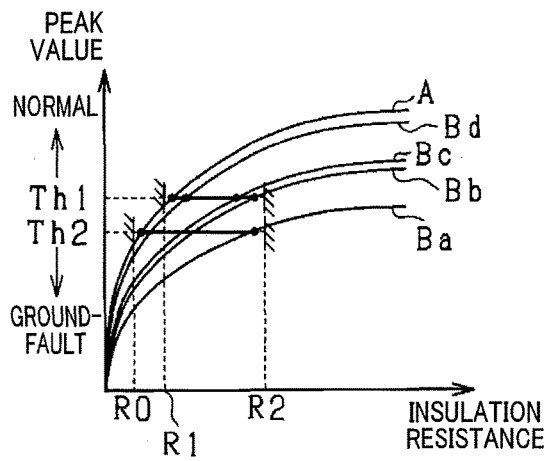
FIG. 6 is a diagram for explaining advantageous effects of a modification of the ground-fault determination process.

There can be a case where the change in amount of the decrease of the peak value of the AC signal is small as shown by the line Bb in FIG. 6 when the SMR 12 is off and the CHGR 13 is on compared to the case shown by the line Bb in FIG. 5. In such a case, it is possible to make the ground-fault determination correctly even if the determination threshold is set to the threshold value Th1.

Figure 7:
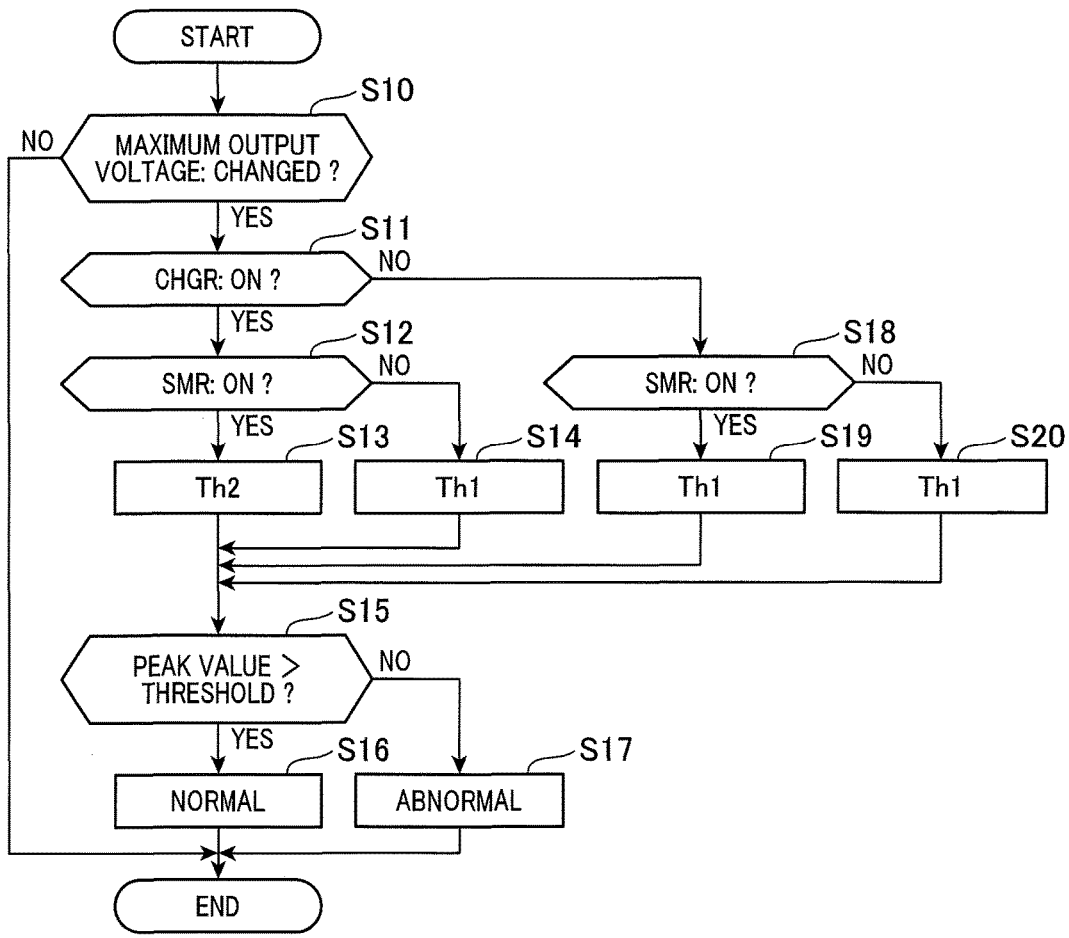
FIG. 7 is a flowchart showing steps of the modification of the ground-fault determination process.

As shown in FIG. 4, in the above embodiment, the determination threshold is set in accordance with the maximum output voltage V determined based on the command signal to the relay drive circuit 40. Instead, the determination threshold may be set in accordance with the value of the common capacitance Cg which depends on the command signal to the relay drive circuit 40. In this case, as shown in the flowchart of FIG. 7 which shows a modification of the ground-fault detection process, when the CHGR 11 is detected to be on in step S11, and the SMR 12 is detected to be on in step S12, since the decrease of the peak value of the AC signal is assumed to be large as shown in the line Ba in FIG. 5, the determination threshold is set to the lower threshold value Th2. In other states, that is, when the CHGR 31 is detected to be on in step S11 and the SMR 12 is detected to be off in step S12, or when the CHGR 31 is detected to be off in step S11 and the SMR 12 is detected to be off in step S12, since the decrease of the peak value of the AC signal is assumed to be below the line Ba, the determination threshold is set to the higher threshold value Th1. Incidentally, when the CHGR 11 is off and the SMR 12 is on, and the voltage step-up operation is performed, the determination threshold is set to the threshold value Th1. The steps shown in FIG. 7 which are the same in content as the steps shown in FIG. 4 are indicated by the same step numbers.

Figure 8:
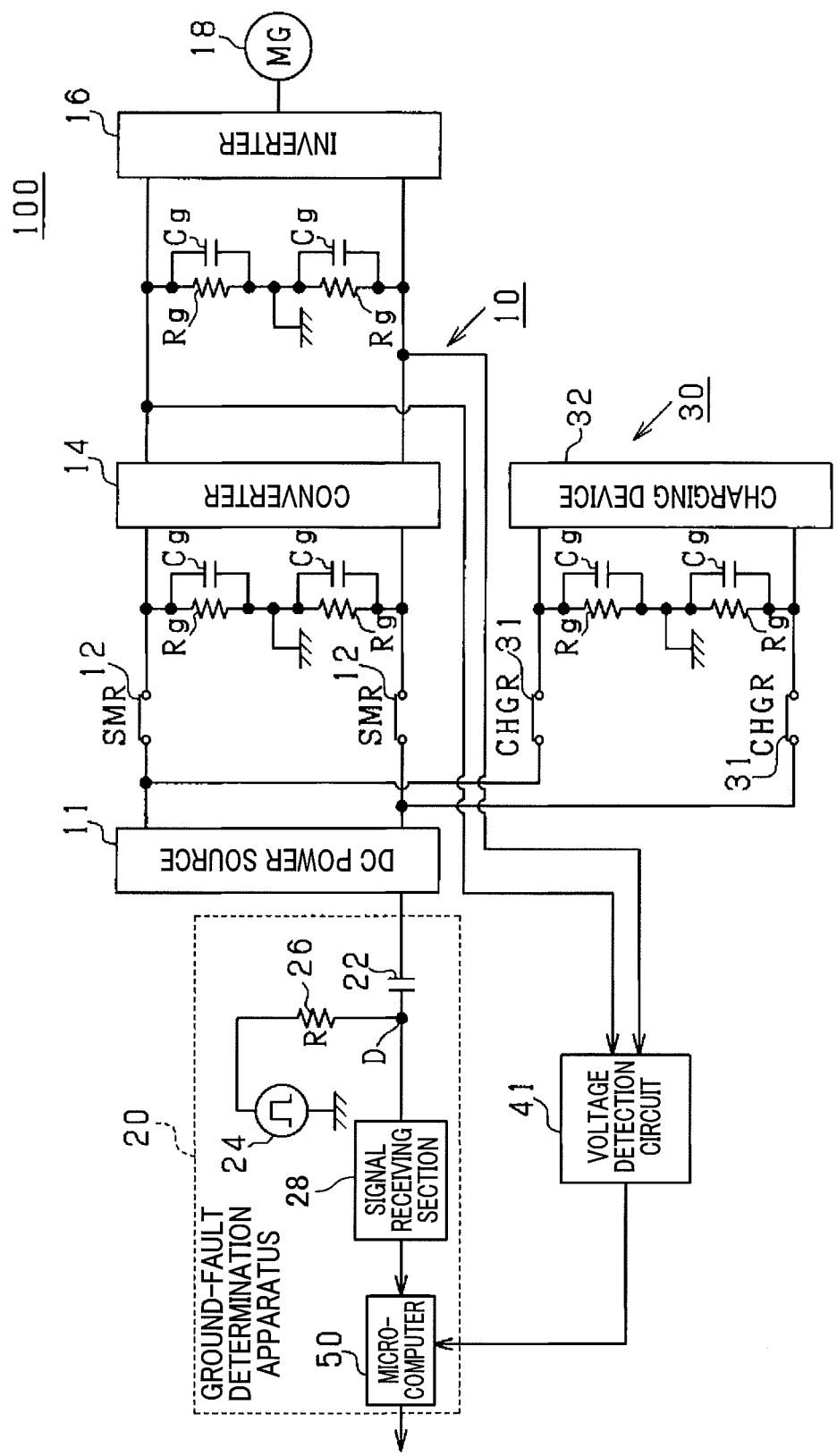
FIG. 8 is a diagram showing the structure of a modification of the ground-fault determination apparatus according to the embodiment of the invention.
Figure 9:
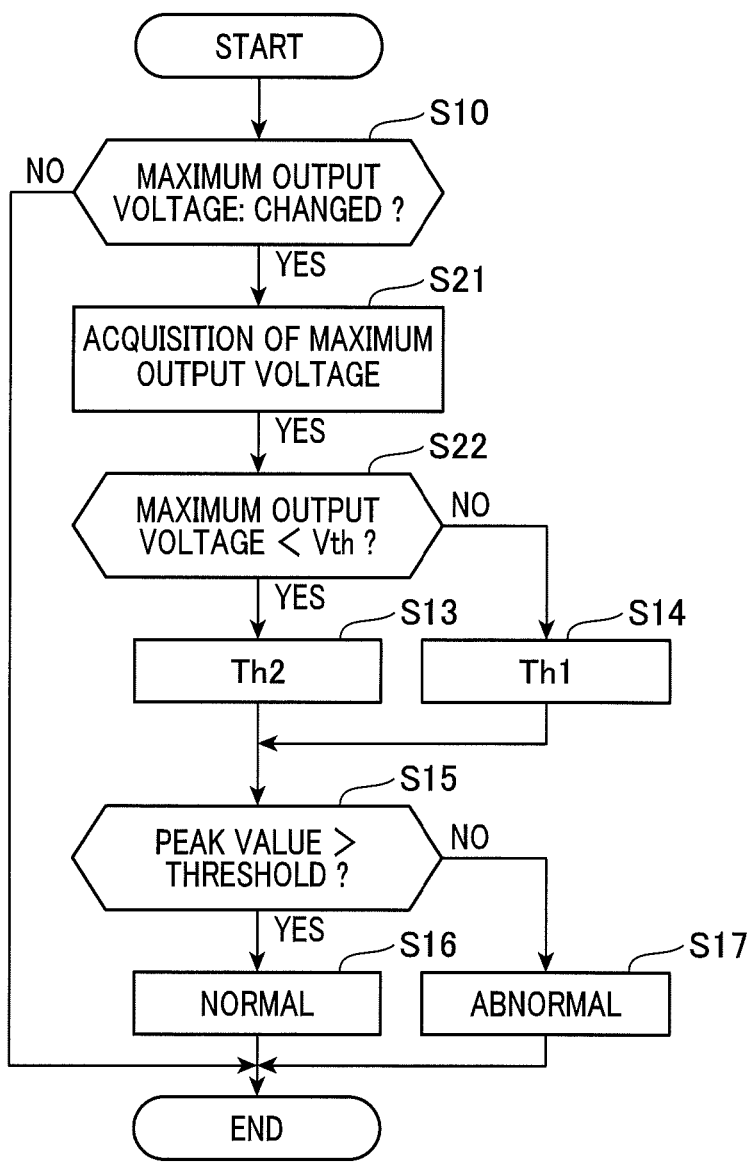
FIG. 9 is a flowchart showing steps of another modification of the ground-fault determination process.

In the above embodiment, the determination threshold is set based on the maximum output voltage V which depends on the command signal to the relay drive circuit 40. Instead, as shown in FIG. 8 which shows a modification of the ground-fault determination apparatus described above, the determination threshold may be set based on the voltage detected by a voltage detection circuit 41. The voltage detection circuit 41 is connected to the wiring path between the converter 14 and the inverter 16. In this modification, the determination threshold is set to the threshold value Th1 when the voltage detected by the voltage detection circuit 41 is a voltage resulting from the voltage conversion by the converter 14. On the other hand, when the voltage detected by the voltage detection circuit 41 is a voltage not resulting from the voltage conversion by the converter 14, that is, the voltage of the DC power source 11, the determination threshold is set to the threshold value Th2. For example, in a modification of the ground-fault detection process shown in FIG. 9, the maximum output voltage is obtained in step S21 if it is determined that the maximum output voltage will be changed in step S10. In step S22, is it determined whether or not the obtained maximum output voltage is smaller than a predetermined threshold value Vth. The threshold value Vh may be set to the maximum output voltage V when the voltage step-up operation is performed, for example. If the determination result in step S22 is affirmative, that is, if the voltage step-up operation is not being performed, the determination threshold is set to the threshold value Th2 in step S13. If the determination result in step S22 is negative, that is, if the voltage step-up operation is being performed, the determination threshold is set to the threshold value Th1 in step S14. The steps shown in FIG. 9 which are the same in content as the steps shown in FIG. 4 are indicated by the same step numbers.

In the modification of the ground-fault determination apparatus shown in FIG. 8, the voltage detection circuit 41 may be connected to both the power conversion device 10 and the charging device 30. In this case, the ground-fault determination threshold can be set in accordance with whether or not the voltage detected by the voltage detection circuit 41 is the maximum output voltage when the converter 14 performs the voltage step-up operation.

Figure 10:
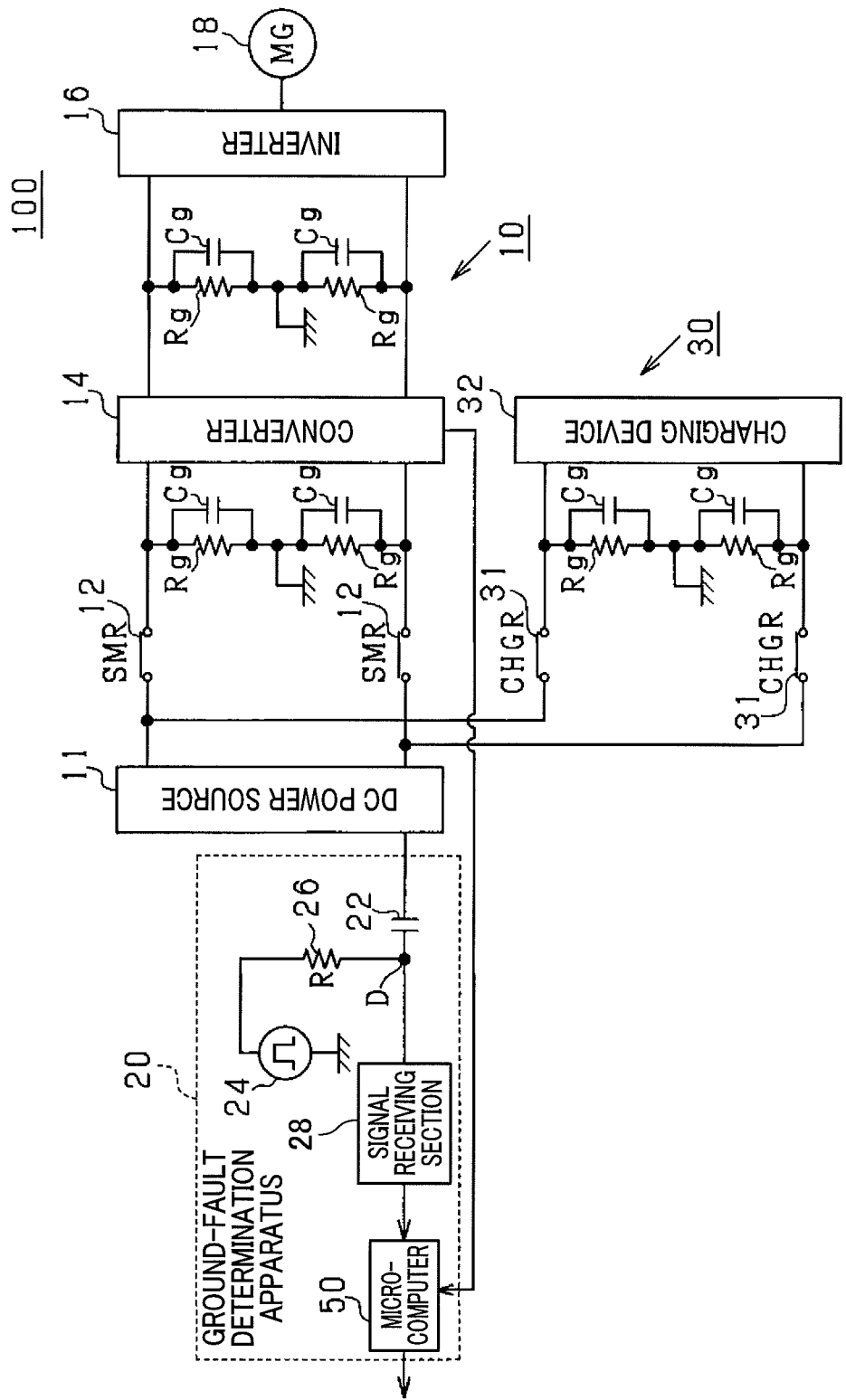
FIG. 10 is a diagram showing the structure of another modification of the ground-fault determination apparatus according to the embodiment of the invention.
Figure 11:
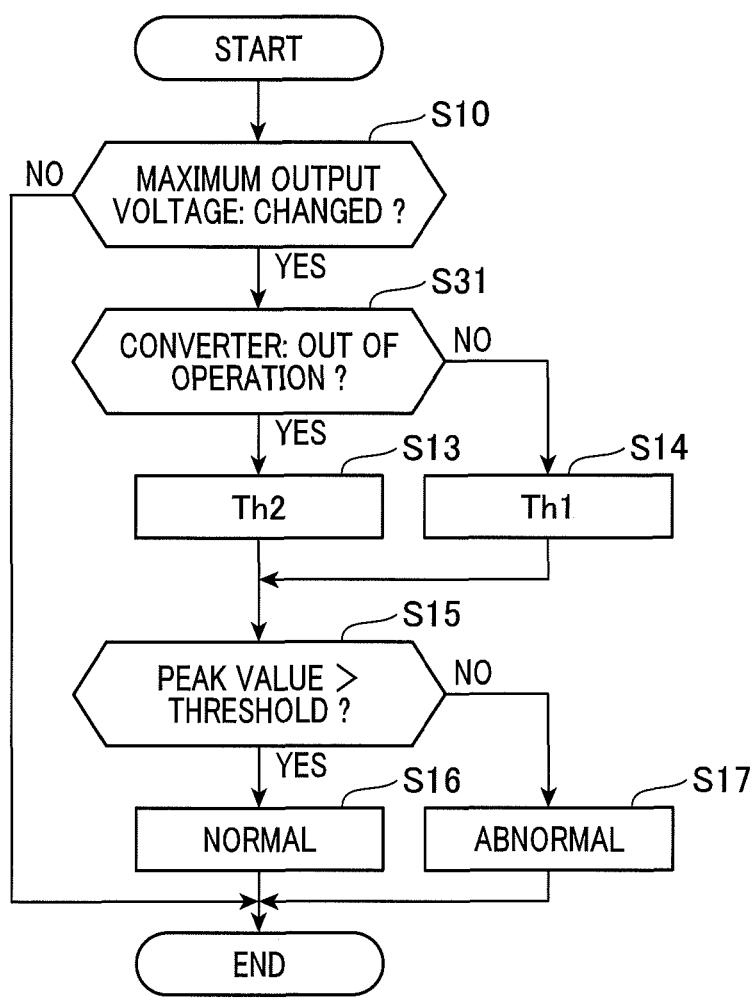
FIG. 11 is a flowchart showing steps of another modification of the ground-fault determination process.

As shown in FIG. 10 which shows another modification of the ground-fault determination apparatus described above, the determination threshold may be set based on the state of the converter 14 (the state of the voltage step-up operation). In this case, as shown in the flowchart of FIG. 11 which shows another modification of the ground-fault detection process, it is determined whether or not the converter 14 is not performing the voltage step-up operation in step S31 if it is determined that the maximum output voltage will change in step S10. If the determination result in step S31 is affirmative (that is, if the voltage step-up operation is not being performed), the determination threshold is set to the threshold value Th2 in step S13. If the determination result in step S31 is negative, the determination threshold is set to the threshold value Th1 in step S14. The steps shown in FIG. 11 which are the same in content as the steps shown in FIG. 4 are indicated by the same step numbers.

In the above embodiment, the maximum output voltage V of the DC supply circuit 100 is determined based on one of the command signal outputted to the relay drive circuit 40, the voltage detected by the voltage detection circuit 41 and the operation state of the converter 14. However, instead, the maximum output voltage V of the DC supply circuit 100 may be determined based on a combination of these parameters.

In the above embodiment, the electrical load connected to the power conversion device 10 is the charging device 30. Other than that, the electrical load may be a solar photovoltaic device or the like.

The maximum output voltage V of the DC supply circuit 100 may decrease due to temporal degradation. Accordingly, the determination threshold may be set taking into account the temporal change of the maximum output voltage V due to temporal degradation of the DC supply circuit 100. For example, when the maximum output voltage resulting from the voltage step-up operation is assumed to be lowered from V1 to Vib, the determination threshold may be set based on the insulation resistance Rg required to the case of the maximum output voltage being V1$b$.

There may be a case where the common capacitance Cg increases with the increase of the maximum output voltage of the DC supply circuit 100, causing the peak value of the AC signal to decrease depending on the type of the electrical load. In this case, the determination threshold may be set so as to increase or decrease with the increase or decrease of the maximum output voltage V of the DC supply circuit 100.

In the above embodiment, the determination threshold is set to one of the two threshold values Th1 and Th2 depending on whether the voltage step-up operation is performed or not. However, in a case where the maximum output voltage V is changed among three or more values, the determination threshold may set to one of the three or more values.

The above explained preferred embodiments are exemplary of the invention of the present application which is described solely by the claims appended below. It should be understood that modifications of the preferred embodiments may be made as would occur to one of skill in the art.

What is claimed is:

1. A ground-fault determination apparatus for use in a vehicle power supply system including a DC power source and a DC supply circuit having at least one electrical load which charges the DC power source or is charged by the DC power source, the DC power source and the DC supply circuit being insulated from a vehicle body, the ground-fault determination apparatus comprising:
   a resistor;
   a capacitor connected in series to the resistor and the DC supply circuit;
   a processor connected to the DC supply circuit via a component of the resistor and capacitor series, the processor being configured to:
      apply an AC signal to the DC supply circuit through the resistor and capacitor series to acquire a peak value of the AC signal divided by a resistance of the resistor and an insulation resistance of the DC supply circuit;
      determine presence or absence of a ground-fault based on a comparison between a predetermined determination threshold and the acquired peak value;
      estimate at least one of a maximum output voltage of the DC supply circuit and a common capacitance between the DC supply circuit and the vehicle body; and
      set a value of the determination threshold based on at least one of the maximum output voltage and the estimated common capacitance.

2. The ground-fault determination apparatus according to claim 1, wherein the processor is further configured to estimate the maximum output voltage of the DC supply circuit, and set the value of the determination threshold to a larger value when the maximum output voltage is larger.

3. The ground-fault determination apparatus according to claim 1, wherein the processor is further configured to estimate the common capacitance of the DC supply circuit, and set the value of the determination threshold to a smaller value when the common capacitance is larger.

4. The ground-fault determination apparatus according to claim 1, wherein the DC supply circuit includes two or more electrical loads which are each electrically connected to the DC power source through respective switches, and the processor is further configured to estimate at least one of the maximum output voltage and the common capacitance in accordance with a connection state of each of the electrical loads to the DC power source through the switches.

5. The ground-fault determination apparatus according to claim 1, further comprising:
   a voltage detection circuit for detecting a voltage corresponding to the maximum output voltage of the DC supply circuit,
   wherein the processor is further configured to estimate at least one of the maximum output voltage and the common capacitance in accordance with the voltage detected by the voltage detection circuit.

6. The ground-fault determination apparatus according to claim 1, wherein the at least one electrical load includes a voltage step-up circuit which performs a voltage step-up operation for stepping up a voltage supplied from the DC power source, and the processor is further configured to estimate at least one of the maximum output voltage and the common capacitance in accordance with whether or not the voltage step-up operation is being performed or not.

7. The ground-fault determination apparatus according to claim 4, wherein one of the electrical loads is a power conversion device for converting electric power supplied from the DC power source to be used to drive the vehicle, and another one of the electrical loads is a charging device for charging the DC power source with electric power supplied from an external power source.

8. The ground-fault determination apparatus according to claim 1, wherein the processor is further configured to make a determination whether there is a change in at least one of the maximum output voltage and the common capacitance, and if the determination is affirmative, the processor is further configured to set the value of the determination threshold in accordance with the maximum output voltage after the change of at least one of the maximum output voltage and the common capacitance.

* * * * *